(12) United States Patent
Itoh et al.

(10) Patent No.: US 8,482,291 B2
(45) Date of Patent: Jul. 9, 2013

(54) SUBSTRATE STRUCTURE

(75) Inventors: Nobutaka Itoh, Kawasaki (JP); Makoto Sakairi, Kawasaki (JP); Mami Nakadate, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 355 days.

(21) Appl. No.: 12/769,122

(22) Filed: Apr. 28, 2010

(65) Prior Publication Data

US 2010/0289500 A1 Nov. 18, 2010

(30) Foreign Application Priority Data

May 18, 2009 (JP) ................................. 2009-119739

(51) Int. Cl.
*G01R 31/08* (2006.01)

(52) U.S. Cl.
USPC ........... 324/525; 324/528; 324/347; 324/370; 324/444; 324/323; 257/778; 257/E23.067; 257/E25.023; 257/737

(58) Field of Classification Search
USPC .................. 324/525, 347, 370, 444, 448, 449, 324/660, 323, 538; 257/778, E23.067, E25.023, 257/737; 438/73
See application file for complete search history.

(56) References Cited

U.S. PATENT DOCUMENTS

| 6,610,430 B1* | 8/2003 | Thompson, Sr. | 428/209 |
|---|---|---|---|
| 6,998,532 B2* | 2/2006 | Kawamoto et al. | 174/521 |
| 8,053,714 B2* | 11/2011 | Kong | 250/208.1 |
| 2003/0218238 A1* | 11/2003 | Kikuchi et al. | 257/678 |
| 2004/0226376 A1* | 11/2004 | Goto et al. | 73/514.32 |
| 2005/0264307 A1 | 12/2005 | Setaka | |
| 2007/0045868 A1* | 3/2007 | Furuyama et al. | 257/778 |
| 2007/0170587 A1* | 7/2007 | Honda | 257/737 |
| 2009/0302410 A1* | 12/2009 | Shibayama | 257/437 |
| 2009/0325401 A1* | 12/2009 | Sakairi et al. | 439/66 |
| 2012/0001642 A1* | 1/2012 | Sylvester et al. | 324/538 |

FOREIGN PATENT DOCUMENTS

| JP | 60154592 A | 8/1985 |
|---|---|---|
| JP | 09-082714 A | 3/1997 |
| JP | 10-93297 A | 4/1998 |
| KR | 2005-0033614 A | 4/2005 |

OTHER PUBLICATIONS

Korean Office Action dated Jun. 27, 2011, issued in corresponding Korean Patent Application No. 10-2010-0045924.

* cited by examiner

*Primary Examiner* — Huy Q Phan
*Assistant Examiner* — Thang Le
(74) *Attorney, Agent, or Firm* — Westerman, Hattori, Daniels & Adrian, LLP

(57) ABSTRACT

A substrate includes a first plate member; a plurality of first electrodes provided on the major surface of the first plate member, the first electrodes including at least one electrode for circuit connection and at least one monitor electrode separate from the electrode for circuit connection; a second plate member; a plurality of second electrodes provided on the major surface of the second plate member; a plurality of solder members provided between the first electrodes and the second electrodes for electrical connection therebetween, repeatedly; and a detector for detecting an electrical disconnection between at least one of the monitor electrode and the second electrode.

12 Claims, 14 Drawing Sheets

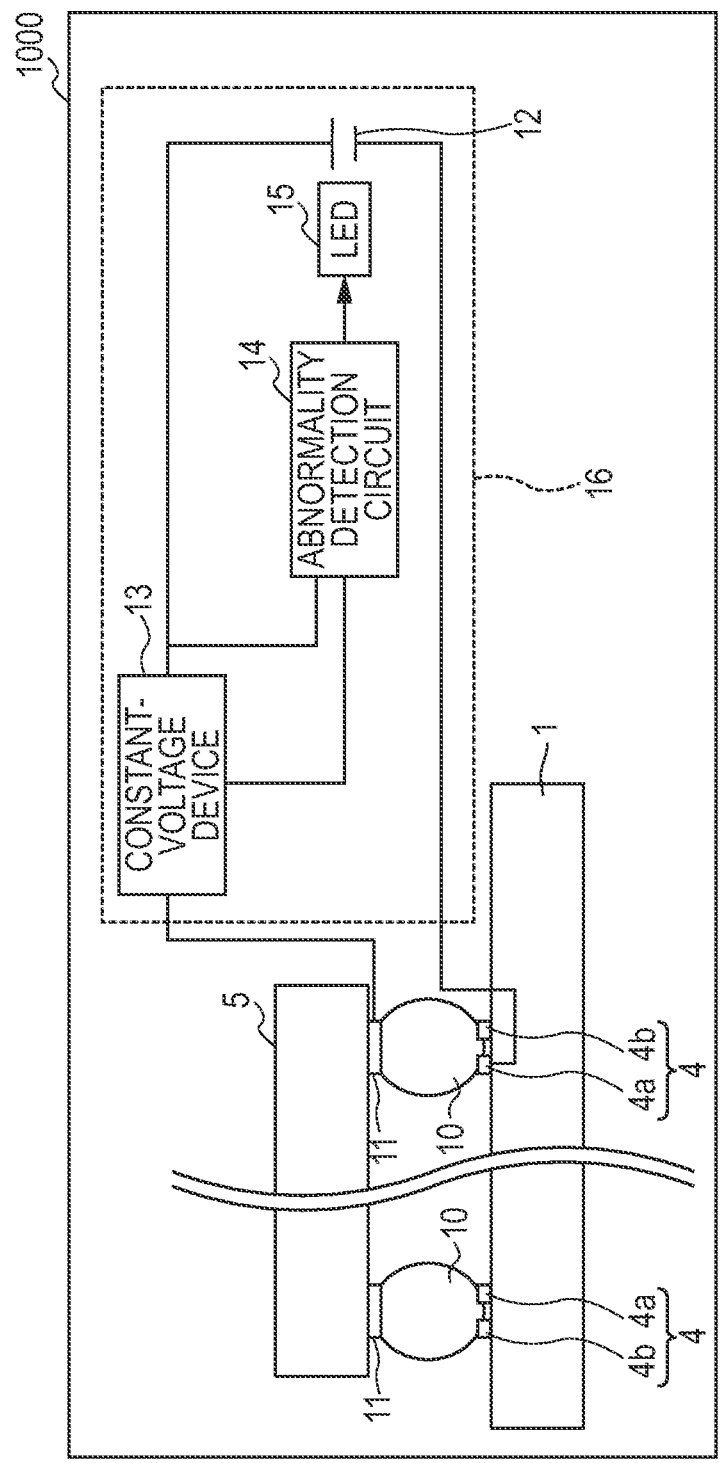

SUBSTRATE STRUCTURE

CROSS-REFERENCE TO RELATED APPLICATIONS

This application is based upon and claims the benefit of priority of the prior Japanese Patent Application No. 2009-119739, filed on May 18, 2009, the entire contents of which are incorporated herein by reference.

FIELD

The embodiments discussed herein are related to a substrate structure.

BACKGROUND

Protruding electrodes called bumps are in some cases used as connecting devices to mount electronic parts on a substrate. The protruding electrodes are formed by depositing solder over electrodes provided on the substrate. For example, BGA (Ball Grid Array) connection structures are used to mount electronic parts on a substrate. In the structure, the protruding electrodes are regularly arrayed by depositing solder over electrodes regularly arrayed on the substrate.

An output terminal of a semiconductor integrated circuit has been disclosed. The output terminal is used to determine whether the protruding electrodes and the electrodes are normally connected. Related-art techniques are disclosed in Japanese Laid-open Patent Publication No. 9-82714.

If the connecting devices are damaged to cause connection failures, transmission of signals is interrupted, resulting in breakdown of an electronic apparatus incorporating the substrate. Accordingly, whether or not the connection of the connecting devices is in a proper condition is desired to be detected as accurately as possible. Furthermore, if there is a possibility of a connection failure, it is advantageous to know the possibility in advance.

SUMMARY

According to an aspect of the invention, a substrate includes a first plate member; a plurality of first electrodes provided on the major surface of the first plate member, the first electrodes including at least one electrode for circuit connection and at least one monitor electrode separate from the electrode for circuit connection; a second plate member; a plurality of second electrodes provided on the major surface of the second plate member; a plurality of solder members provided between the first electrodes and the second electrodes for electrical connection therebetween, repeatedly; and a detector for detecting an electrical disconnection between at least one of the monitor electrode and at least one of the second electrodes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a block diagram illustrating part of the internal structure of a personal computer according to the first embodiment;

DESCRIPTION OF EMBODIMENTS

Embodiments will be described hereinbelow with reference to the attached drawings. However, the drawings do not sometimes illustrate the parts in completely the same sizes, proportions, etc. as those of actual ones. The details are omitted in some drawings.

First Embodiment

Figure 1A:
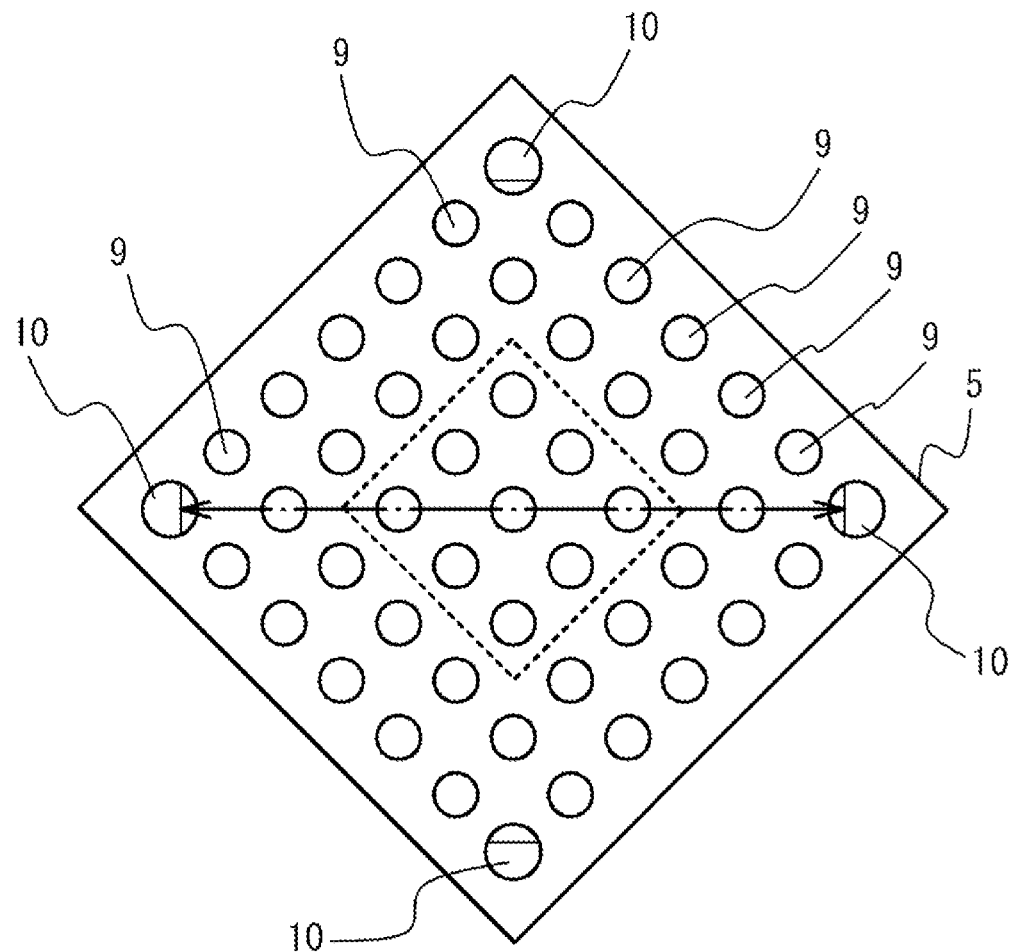
FIG. 1A is a top view illustrating the arrangement of bumps and pad electrodes of a substrate structure according to a first embodiment.
Figure 1B:
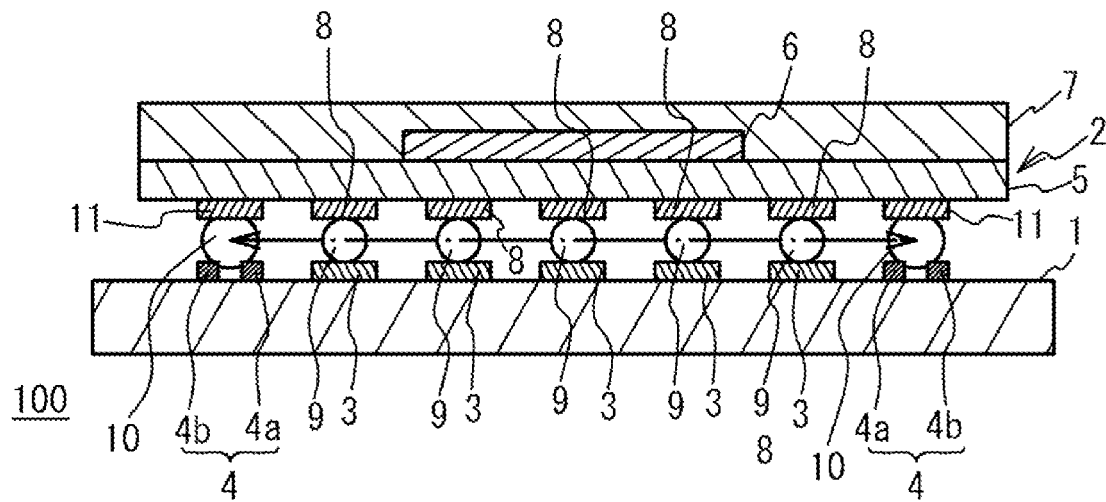
FIG. 1B is a cross-sectional view illustrating the arrangement of the bumps and the pad electrodes of the substrate structure according to the first embodiment.
Figure 3:
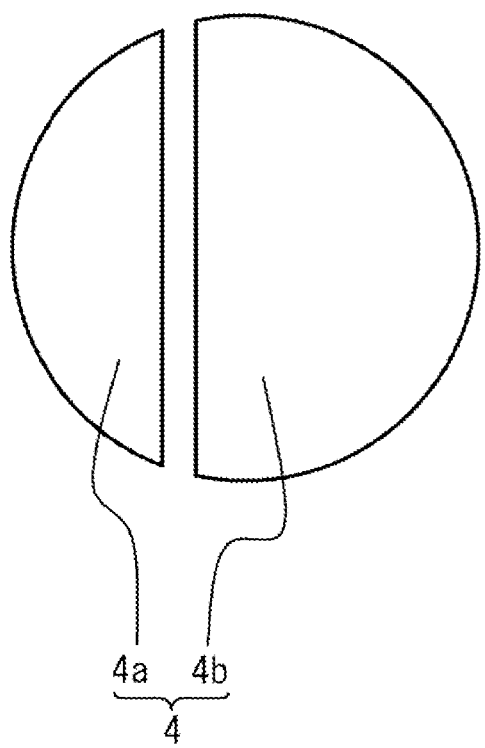
FIG. 3 is an enlarged view of separate electrodes.
Figure 4:
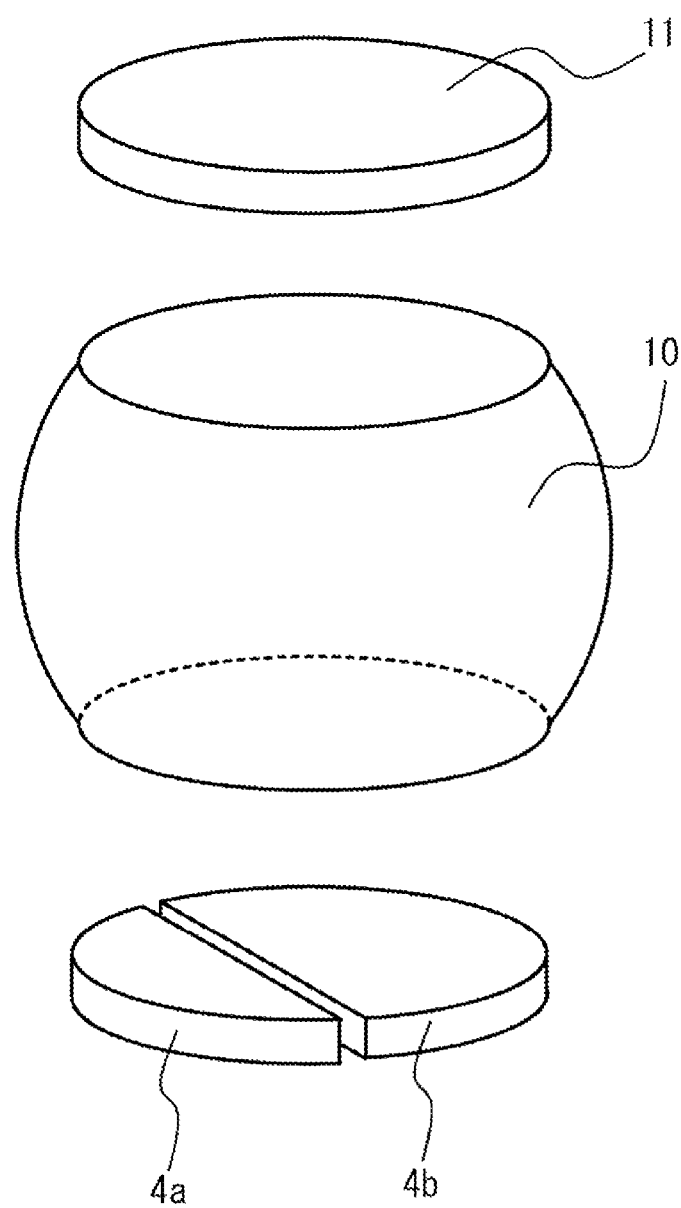
FIG. 4 is a perspective view illustrating the pad electrodes and the target bump in an exploded state.

FIGS. 1A and 1B are explanatory diagrams illustrating the arrangement of bumps 9, bumps to be measured (hereinafter referred to as target bumps) 10, pad electrodes 3 and 4, and pad electrodes 8 and 11 of a substrate structure 100 according to a first embodiment. The bumps 9 and the target bumps 10 are protruding electrodes, which are examples of connecting devices in this specification. FIG. 1A is a top view of the arrangement of the bumps 9 and the target bumps 10; and FIG. 1B is a cross-sectional view taken along a diagonal line along which the distance of the arrangement of the bumps 9 and the target bumps 10 is the longest. FIG. 2 is a block diagram illustrating part of the internal structure of a personal computer that is an example of an electronic apparatus. FIG. 3 is an enlarged view of separate electrodes. FIG. 4 is a perspective view illustrating the pad electrodes 4 and 11 and the target bump 10 in an exploded state.

In the substrate structure 100, an LSI (large-scale integration) package 2 is mounted on a first substrate (first plate member) 1 serving as a motherboard. The LSI package 2 is configured such that a chip 6, which is an example of an electronic component, is mounted on a second substrate (second plate member) 5, and the periphery of which is coated with a sealing resin 7.

The first substrate 1 has, on the top, pad electrodes 3 and 4 serving as first substrate electrodes. The second substrate 5 has, at the lower surface, pad electrodes 8 and 11 serving as second substrate electrodes. Here, the pad electrode (first electrode) 4 and the pad electrode (second electrode) 11 are pad electrodes connected by the target bumps 10 to be described later in detail.

The substrate structure 100 has the bumps 9 that connect the pad electrodes 3 and the pad electrode 8 together and the target bumps 10 that connect the pad electrodes 4 and the pad electrodes 11 together. As illustrated in FIG. 1A, the bumps 9 and the target bumps 10 are arranged in seven rows and seven columns in a rectangular shape. The target bumps 10 are bumps used to detect abnormality, such as a crack or peel-off. In the first embodiment, Bumps located at the corners of the rectangle are used as the target bumps 10. At least one of the pad electrodes 4 and the pad electrodes 11 corresponding to the target bumps 10 includes a plurality of pieces. In the example illustrated in FIGS. 1A and 1B, the bumps 4 that are first-substrate-side electrodes include a plurality of pieces. As illustrated in FIGS. 3 and 4, the pad electrodes 4 include a first separate electrode 4a and a second separate electrode 4b of different sizes. If a comparison is made between the sizes, the first separate electrode 4a is smaller than the second separate electrode 4b. For example, the first separate electrode 4a may correspond to a monitor electrode and the second separate electrode 4b may correspond to an electrode for circuit connection.

As illustrated in FIG. 2, the substrate structure 100 is provided with a disconnection detector 16 including the first separate electrodes 4a, the bumps 10 to which the first separate electrodes 4a are connected respectively, and the pad electrodes 11. The disconnection detector 16 includes a constant-voltage device 13, an abnormality detection circuit 14, and an LED (light emitting diode) 15 which is an example of warning means.

Figure 5:
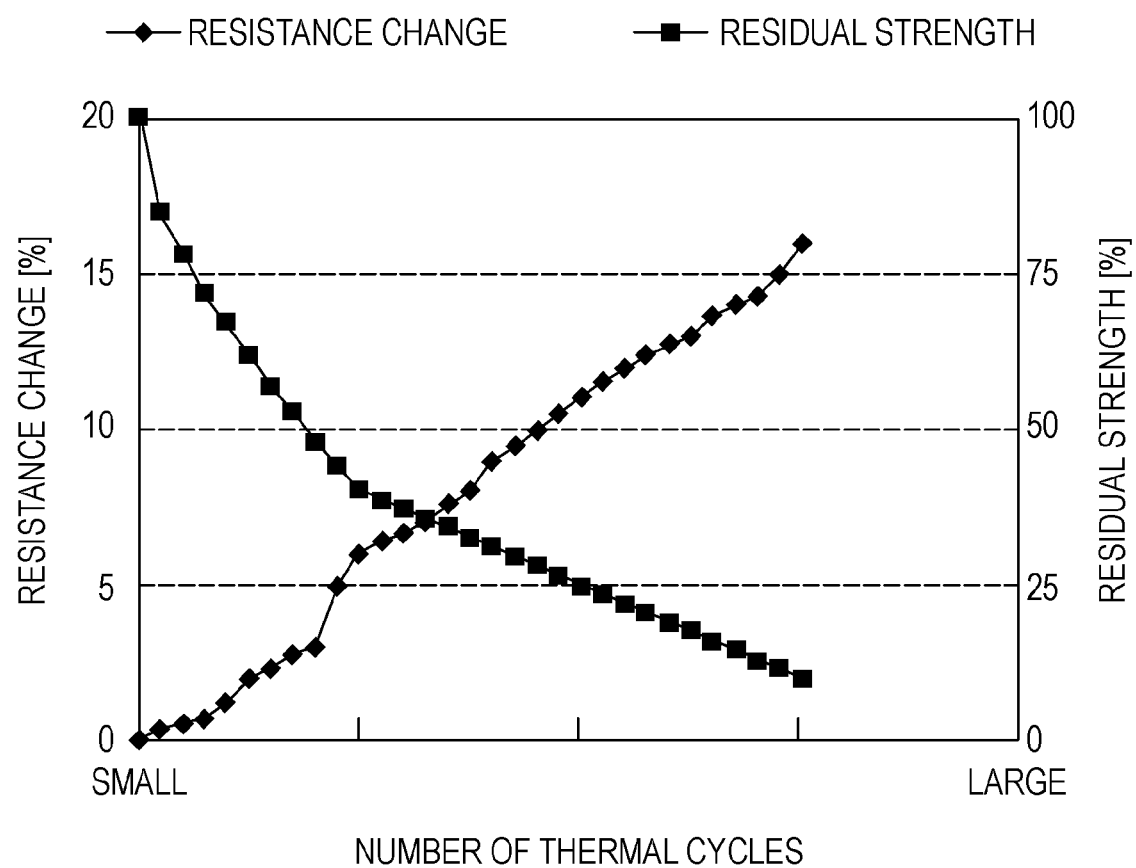
FIG. 5 is a graph illustrating the relationship between the number of thermal cycles that act on the bumps and the resistance change and residual strength of the target bumps.

FIG. 5 is a graph illustrating the relationship between the number of thermal cycles that act on the substrate structure 100 and the resistance change and residual strength of the target bumps 10. This shows that the damage of the target bumps 10 increases with an increasing number of thermal cycles, thus reducing the strength and increasing the resistance change. Since the resistance change and the residual strength of the target bumps 10 have correlation, the strength of the target bumps 10 can be grasped by detecting changes in the resistance of the target bumps 10. Also by measuring the current-carrying state or the voltage instead of detecting the resistance, the strength and the condition of the target bumps 10 can be grasped.

The disconnection detector 16 detects abnormality by detecting electrical interruption, that is, electrical disconnection, between the first separate electrodes (monitor electrodes) 4a and the target bumps 10 that pair with the pad electrodes 4. The operation of the disconnection detector 16 will be described later in detail.

The target bumps 10 will be described hereinbelow in detail. As illustrated in FIG. 1A, the substrate structure 100 has a large number of bumps. The target bumps 10 are selected from such a large number of bumps in accordance with the following course:

Bumps at locations at which damages, such as a crack and peel-off, are prone to occur owing to the action of a duty cycle on the substrate structure 100 are selected as the target bumps 10. In the first embodiment, the bumps 10 located at the corners of the arrangement are selected in consideration of the number of thermal cycles during which a thermal stress repeatedly acts on the substrate structure 100. Specifically, as illustrated in FIG. 1A, among the bumps arranged in the direction in which the second substrate 5 is the longest, the bumps located at the ends of the arrangement are selected as the target bumps 10. The direction in which the rectangular second substrate 5 is the longest corresponds to a diagonal line.

The reason why the bumps along the direction in which the second substrate 5 is the longest are selected is that the abnormality of the bumps is thought to be caused by a difference in thermal expansion coefficient between the first substrate 1 serving as the motherboard and the LSI package 2. In other words, this is in consideration of the fact that distortion in the substrate structure 100 is influenced by a value obtained by multiplying a difference in thermal expansion coefficient between the first substrate 1 and the LSI package 2 by the distance therebetween. By selecting bumps at locations susceptible to thermal cycles as the target bumps 10, abnormality in the substrate structure 100 can be detected in its early stages.

The locations of the target bumps 10 can be selected variously depending on the configuration of the substrate structure. Examples of loads that act on the substrate structure include temperature, humidity, vibration, and shock. The locations of the target bumps 10 can be changed as appropriate depending on a factor to which importance is attached among such factors. To select concrete locations, experiments and simulations are effective.

Next, the pad electrode 4 will be described. The pad electrode 4 includes the small first separate electrode 4a and the second separate electrode 4b larger than that, as described above. The first separate electrode 4a and the second separate electrode 4b are arranged in parallel along a diagonal line. Such a separation pattern is based on the simulation result that the target bumps 10 are damaged from part close to the center of the LSI package 2. In other words, a stress is concentrated on the part, of each target bump 10, close to the center of the LSI package 2. Thus, the separation pattern is adopted in consideration of the fact that damages on the target bumps 10 occur from the part on which a stress is concentrated and develop therefrom.

The thus-separate pad electrodes 4 are located such that the smaller first separate electrodes 4a are located at the regions of the target bumps 10 where damages are prone to occur in the early stages. This placement can improve the sensitivity of detecting the abnormality of the target bumps 1. The damages of the bumps occur in such a manner that a crack or peel-off first occurs in part of the bumps and then develops therefrom. Therefore, by forming the above-described disconnection detector 16 so as to include the first separate electrodes 4a located at regions where damages are prone to occur in the early stages, abnormality of the bumps can be detected before the connection by the bumps are completely shut off. Here, the abnormality can be detected owing to the interruption of current or an increase in resistance between the first separate electrodes 4a and the target bumps 10 that pair with the pad electrodes 4. In consideration of it, the smaller pad electrodes incorporated in the disconnection detector 16, the higher the sensitivity is. In other words, the smaller the pad electrodes, the longer the distance from the target bumps 10. This allows the disconnection detector 16 to easily transmit an abnormality signal, thus improving the sensitivity.

Figure 6:
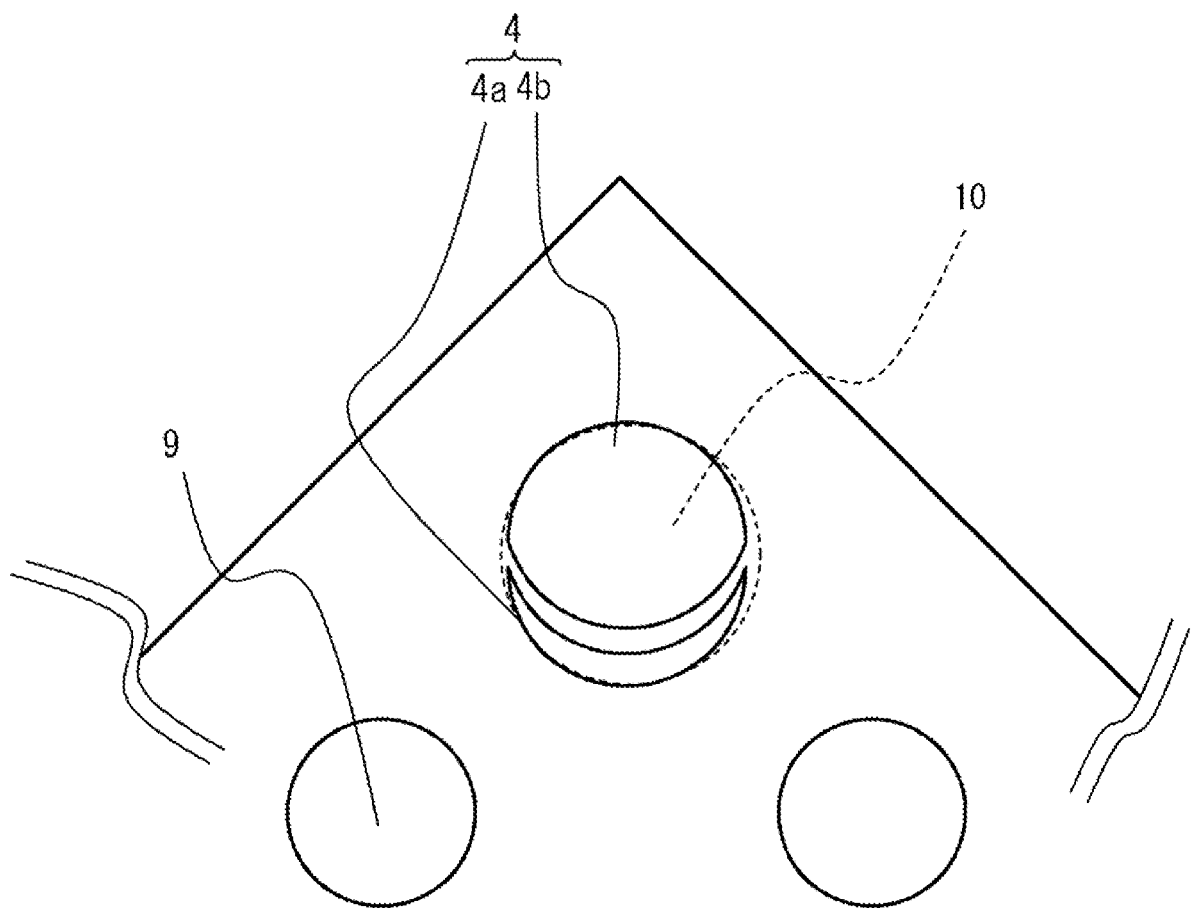
FIG. 6 is an explanatory diagram illustrating an example of the separate electrodes.

The first separate electrode 4a can be shaped like a crescent moon, as illustrated in FIG. 6, on the basis of a simulation. The result of the simulation showed that, when the substrate structure 100 is subjected to repeated thermal stress, a crescent-shaped stress-concentrated region is present in each of the target bumps 10. By adopting the shape of the first separate electrode 4a corresponding to the shape of such a stress-concentrated region, the sensitivity of abnormality detection can be further improved. In other words, by adopting the shape of the first separate electrode 4a corresponding to the stress-concentrated region, electrical interruption between the first separate electrode 4a and the target bump 10 can be detected in the early stages.

Figure 7:
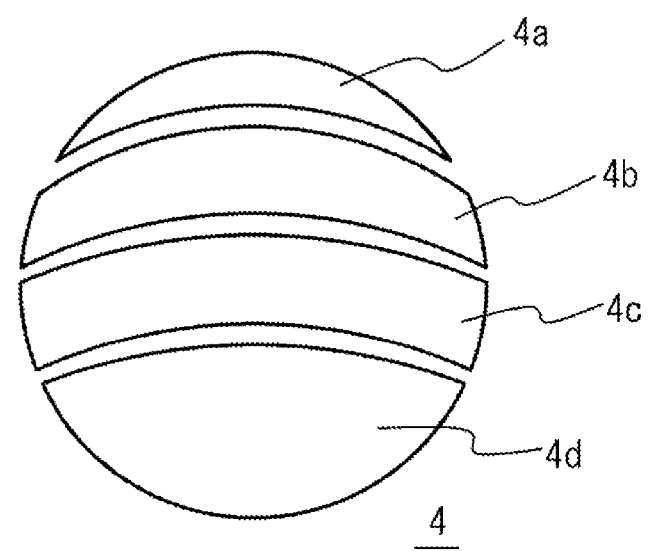
FIG. 7 is an explanatory diagram illustrating another example of the separate electrodes.

In this way, each monitor electrode on the first substrate is provided so as to evaluate an electrical connection between the other electrode for circuit connection on the first substrate and the pad electrodes on the second substrate. The separation pattern and size of each pad electrode 4 can be determined in consideration of a stress that acts on the target bumps 10. Furthermore, as illustrated in FIG. 7, the pad electrode 4 may also be arranged in consideration of development of damage. The pad electrode 4 illustrated in FIG. 7 includes four pieces, that is, the first separate electrode 4a, the second separate electrode 4b, a third separate electrode 4c, and a fourth separate electrode 4d. Among them, the first separate electrode 4a is disposed at a region to which a stress is concentrated to cause damage most. The damage develops from the first separate electrode 4a toward the fourth separate electrode 4d. Therefore, the electrical interruption from the target bump 10 develops from the first separate electrode 4a toward the fourth separate electrode 4d. Thus, providing the disconnection detector 16 for each of the electrodes 4a to 4b allows the degree of the development of the damage of the target bump 10 to be checked.

In this way, if the degree of the development of the damage can be checked, it can be used, for example, to determine time for repair.

As described above, the separation pattern of the pad electrode and the size and shape of the separate electrodes are advantageously determined on the basis of the result of an experiment or simulation. Smaller separate electrodes are disposed at locations to which a stress is concentrated so that damages are more likely to occur on the basis of the result of the experiment or simulation. Accordingly, unlike the example illustrated in FIGS. 1B and 3, the outer-side second separate electrodes 4b may be set smaller than the first separate electrodes 4a.

Next, the details of the disconnection detector 16 will be described with reference to FIG. 8. The disconnection detector 16 is connected to the smallest separate electrode. In other words, with the substrate structure 100 of the first embodiment, the first separate electrode 4a is connected to the disconnection detector 16. The disconnection detector 16 includes a first power supply 12 that is a direct-current power supply connected to the target bump 10 through a first lead wire 19 and a second lead wire 20. The first lead wire 19 electrically connects the first power supply 12 and the pad electrode 11 together. The second lead wire 20 electrically connects the first separate electrode 4a and the first power supply 12 together. The disconnection detector 16 includes a constant-voltage device 13. The IN of the constant-voltage device 13 is connected to the first power supply 12, and the OUT of the constant-voltage device 13 is connected to the pad electrode 11. The GRN (ground) of the constant-voltage device 13 is connected to the second lead wire 20.

The disconnection detector 16 further includes an abnormality detection circuit 14. The configuration and operation of the abnormality detection circuit 14 will be described hereinbelow. The abnormality detection circuit 14 includes a first resistor R1 and a second resistor R2 that divide a voltage input to the constant-voltage device 13 between the first lead wire 19 and the second lead wire 20. The node between the first and second resistors R1 and R2 and the first lead wire 19 is located between the first power supply 12 and the IN of the constant-voltage device 13. The first resistor R1 and the second resistor R2 are connected in series. A third resistor R3 and a fourth resistor R4 that divide a voltage output from the constant-voltage device 13 are disposed between the first lead wire 19 and the second lead wire 20. The node between the third and fourth resistors R3 and R4 and the first lead wire 19 is located between the pad electrode 11 and the OUT of the constant-voltage device 13. The third resistor R3 and the third resistor R3 are connected in series.

The abnormality detection circuit 14 includes a comparator circuit 18. The comparator circuit 18 compares a divided voltage V1 of a voltage input to the constant-voltage device 13 and a divided voltage V2 of a voltage output from the constant-voltage device 13 and outputs an abnormality signal depending on the result. The comparator circuit 18 is connected between the first resistor R1 and the second resistor R2 through a third lead wire 21 and is connected between the third resistor R3 and the fourth resistor R4 through a fourth lead wire 22. A second power supply 17 for operating the comparator circuit 18 is connected to the comparator circuit 18.

The values of the first resistor R1, the second resistor R2, the third resistor R3, and the fourth resistor R4 are set to satisfy the conditions below. Specifically, the individual resistances are set so that V1>V2 holds under a normal condition when the electrical conduction between the target bump 10 and the first separate electrode 4a is kept, and V1<V2 holds under an abnormal condition when the electrical conduction between the target bump 10 and the first separate electrode 4a is interrupted.

The operation of the abnormality detection circuit 14 will be described. First, a direct current output from the first power supply 12 is supplied to the constant-voltage device 13. The voltage input to the constant-voltage device 13 is divided by the first resistor R1 and the second resistor R2, and the obtained divided voltage V1 is input to the noninverting input terminal of the comparator circuit 18.

A voltage output from the constant-voltage device 13 is divided by the third resistor R3 and the fourth resistor R4, and the obtained divided voltage V2 is input to the inverting input terminal of the comparator circuit 18.

The comparator circuit 18 thus compares the voltages input to and output from the constant-voltage device 13.

Under the normal condition when the electrical conduction between the target bump 10 and the first separate electrode 4a is kept, the constant-voltage device 13 reduces its output voltage and current using its protecting function. Therefore, the divided voltage V1 and the divided voltage V2 has the relation V1>V2. In this state, the output voltage of the comparator circuit 18 is at low level, and the abnormality signal 23 indicates there is no abnormality.

On the other hand, when the electrical conduction between the target bump 10 and the first separate electrode 4a is interrupted, the protecting function of the constant-voltage device 13 is cancelled, so that the output voltage and current increase. Therefore, the divided voltage V2 increases to bring the relationship between the divided voltage V1 and the divided voltage V2 into V1<V2.

Thus, the output voltage of the comparator circuit 18 is inverted to output the abnormality signal 23 at high level, indicating that abnormality is detected.

Figure 9:
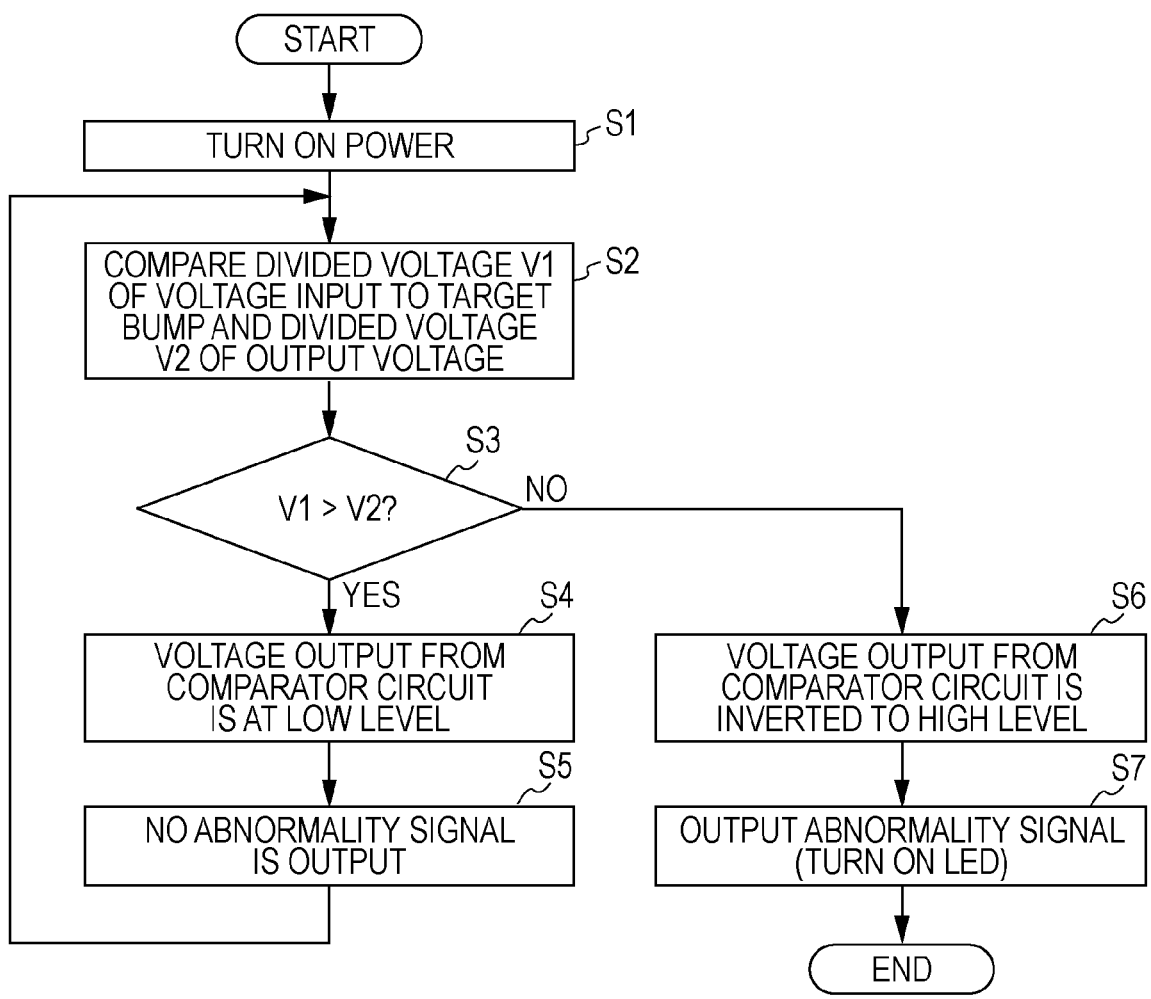
FIG. 9 is a flowchart illustrating an example of an abnormality detection process.

The process of detecting abnormality by the disconnection detector 16 described above will be described with reference to the flowchart illustrated in FIG. 9.

First, when the power of the personal computer 100 is turned on, abnormality detection is started at the same time (step S1). In step S2, the divided voltage V1 of a voltage input to the target bump 10 and the divided voltage V2 of an output voltage are compared. In step S3, if V1>V2 holds, that is, YES, the process proceeds to step S4. In this case, the output voltage of the comparator circuit 18 is at low level (step S4). Accordingly, no abnormality signal is output (step S5). After the process of step S5, the processes after step S2 are performed again. In contrast, if NO in step S3, the process proceeds to step S6. In this case, the output voltage of the comparator circuit 18 is inverted into high level (step S6). Accordingly, the comparator circuit 18 outputs an abnormality signal to turn on the LED (step S7).

In this way, abnormality of the target bump 10 can be detected.

In the above example, although abnormality detection is performed when the power of the personal computer 1000 is on, the abnormality detection may be performed all the time. Alternatively, the abnormality detection may be performed every time the power of the personal computer 1000 is turned on.

As described above, the use of the disconnection detector 16 allows the abnormality of the bump 10 of the substrate structure 100 to be detected. Since electrical conduction between the second separate electrode 4b and the target bump 10 is maintained at the point where abnormality is detected, as described above, the electrical conduction between the first substrate 1 and the LSI package 2 by the target bump 10 is maintained. Accordingly, the function of the personal computer 1000 is maintained. In other words, with the substrate structure 100 of this embodiment, the occurrence of a connection failure can be grasped in advance before the electrical conduction between the bump 10 and the pad electrode 4 is completely interrupted to cause the connection failure.

Figure 10:
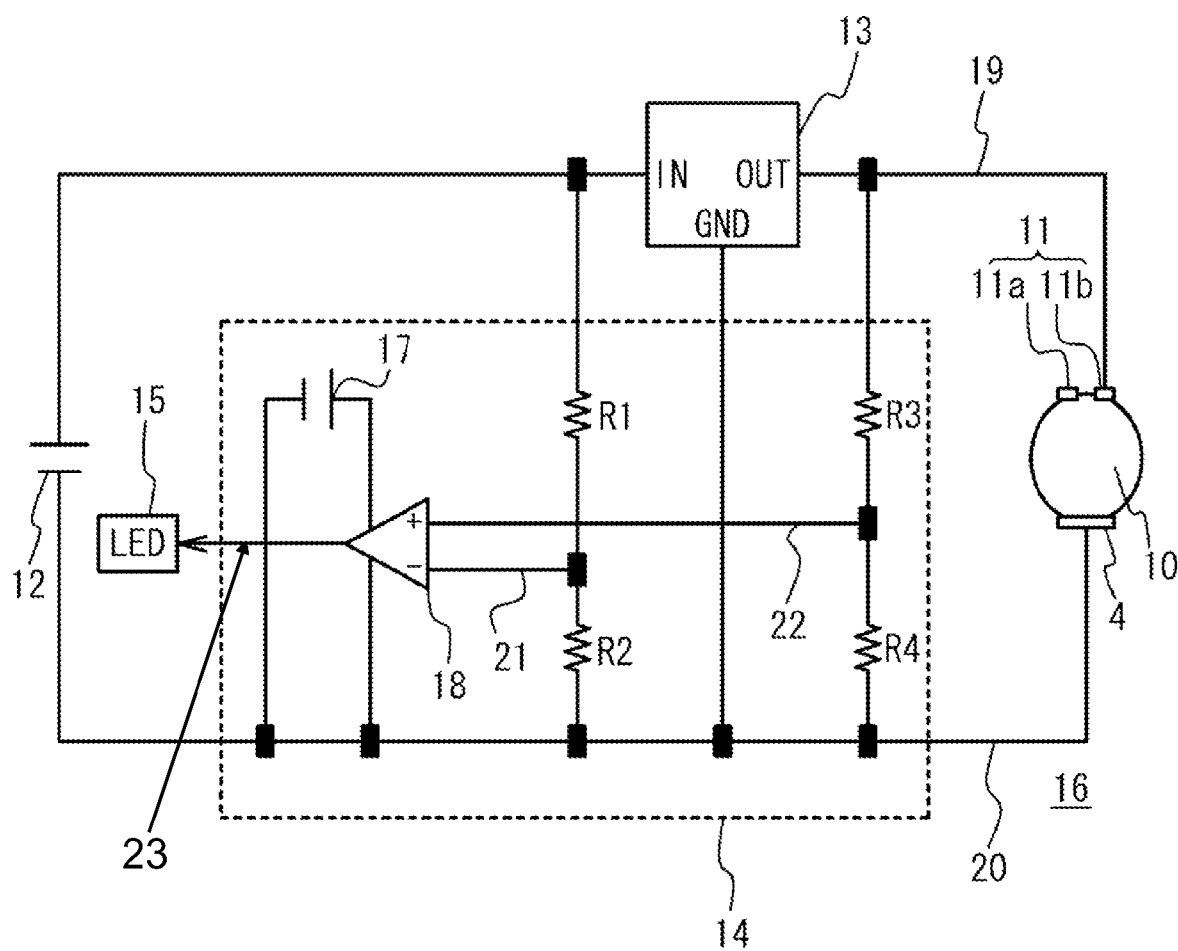
FIG. 10 is a circuit diagram illustrating another example of the disconnection detector.

The example of the substrate structure 100 described above is configured to detect connection failures between the pad electrodes 4 and the target bumps 10 provided on the first substrate 1. With the substrate structure 100 of this embodiment, pad electrodes that each include a plurality of pieces and are each provided with the disconnection detector 16 may be appropriately selected. For example, as illustrated in FIG. 10, the pad electrodes 11 provided on the second substrate 5 may includes a first separate electrode 11a and a second separate electrode 11b. With such a configuration, a connection failure due to peel-off or the like generated at the LSI package 2 can be grasped. Since the configuration of the disconnection detector 16 itself has been described above, a detailed description thereof will be omitted.

Figure 11:
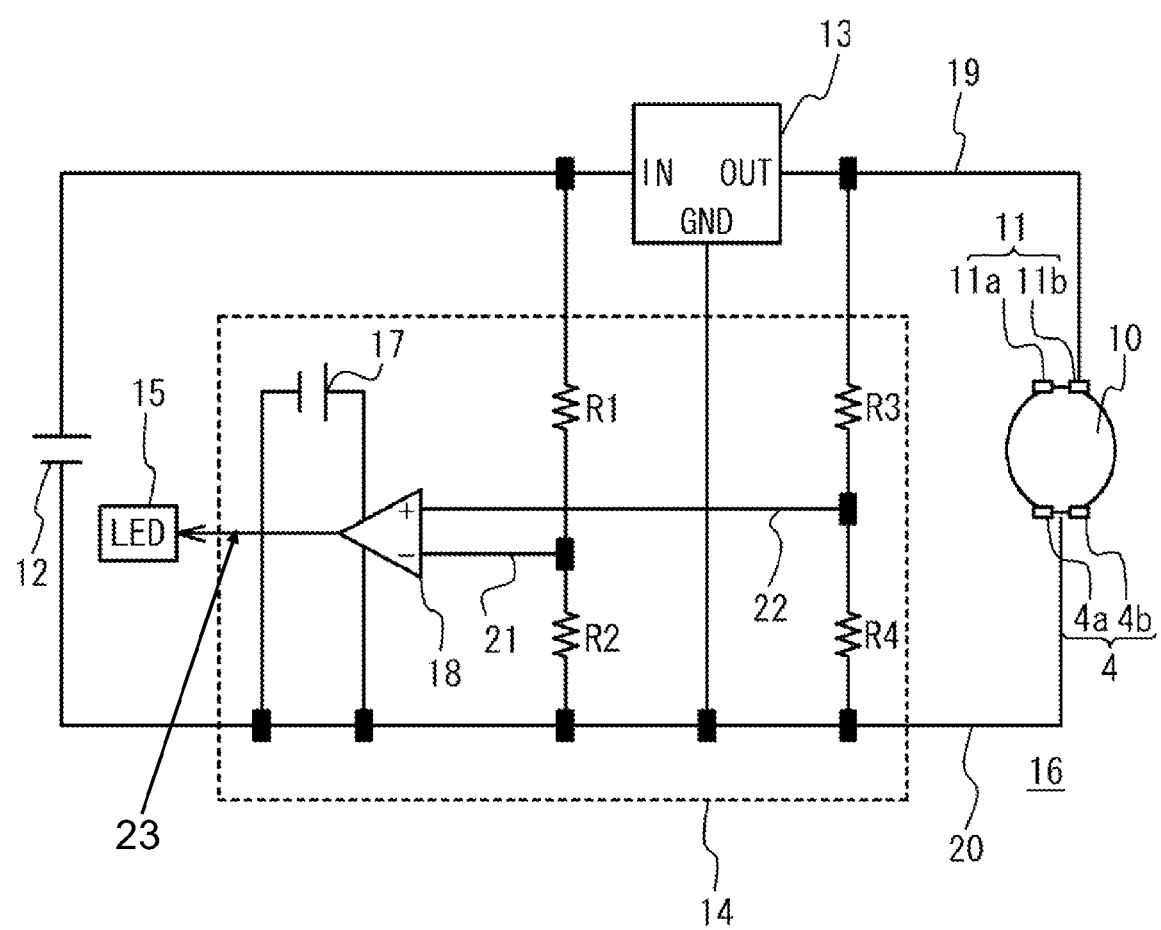
FIG. 11 is a circuit diagram illustrating another example of the disconnection detector.

As illustrated in FIG. 11, both the pad electrodes 4 provided on the first substrate 1 and the pad electrodes 11 provided on the second substrate 5 may each includes a plurality of pieces. With such a configuration, a connection failure due to peel-off or the like generated either the first substrate 1 or the LSI package 2 can be grasped. Since the configuration of the disconnection detector 16 itself has been described above, a detailed description thereof will be omitted.

As described above, the disconnection detector 16 can be disposed at a location where an initial damage is predicted to occur.

The occurrence of abnormality can be detected in the early stages, thus allowing measures, such as repair, to be taken.

Second Embodiment

Next, a substrate structure 200 according to a second embodiment will be described.

As described above, among a large number of bumps, a damage-prone bump and a location of the damage-prone bump where the damage tends to occur in the early stages depend on the structure of the substrate.

Figure 12A:
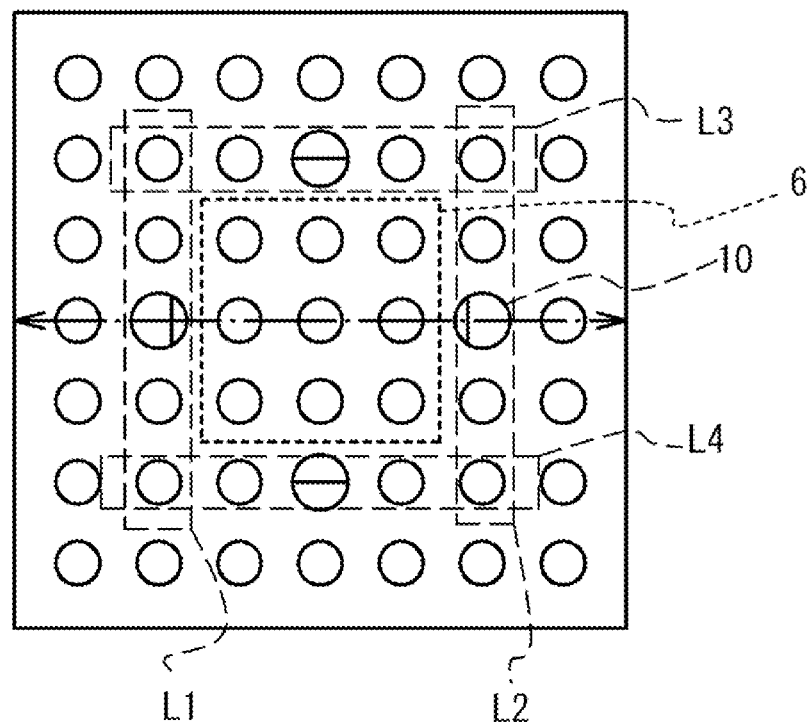
FIG. 12A is a top view illustrating the arrangement of the bumps and the pad electrodes of a substrate structure according to a second embodiment.
Figure 12B:
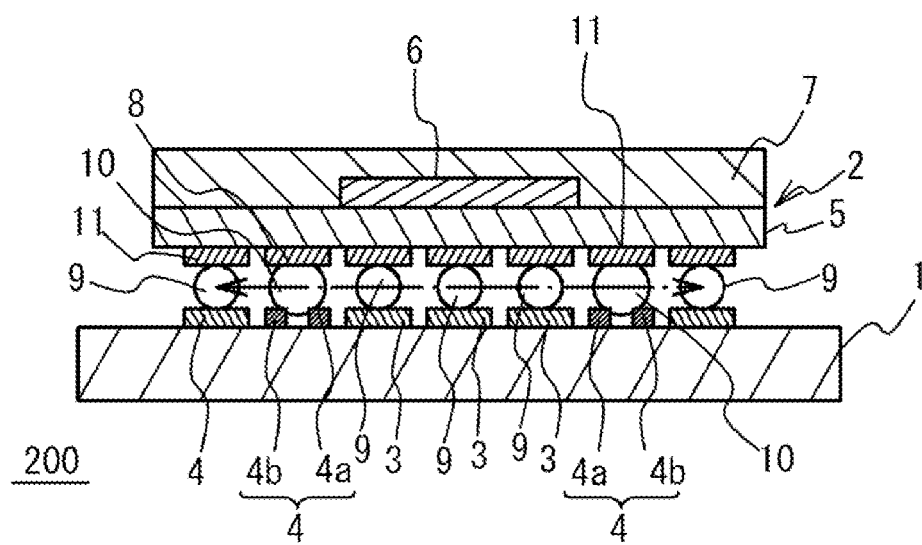
FIG. 12B is a cross-sectional view illustrating the arrangement of the bumps and the pad electrodes of the substrate structure according to the second embodiment.

Points different from the first embodiment will be described hereinbelow with reference to FIGS. 12A and 12B. FIG. 12A is a top view of the arrangement of the bumps 9 and the target bumps 10, and FIG. 12B is a cross-sectional view of the second substrate 5 taken along a side edge. Components common to the substrate structure 100 of the first embodiment are given the same reference numerals, and descriptions thereof will be omitted.

The substrate structure 200 of the second embodiment is configured such that, among the bumps 9 arranged around the chip 6, which is an example of an electronic component, bumps located beside and close to the chip 6 are selected as the target bumps 10; and the pad electrodes 4 corresponding to the target bumps 10 includes a plurality of pieces. A separation line of the pad electrode 4 is approximately parallel to the side edge of the chip 6, the side edge being adjacent to the target bump 10 corresponding to the pad electrode 4. The first separate electrode 4a and the second separate electrode 4b are arranged in perpendicular to the side edge of the chip 6, the side edge being adjacent to the target bump 10 corresponding to the pad electrode 4. In FIG. 12A, reference numerals L1, L2, L3, and L4 denote the arrays of bumps located around the chip 6. The target bumps 10 can be appropriately selected from those arrays by a simulation or an experiment. In this embodiment, bumps located at the center of the individual arrays L1 to L4 are selected as the target bumps 10.

The substrate structure 200 is configured in consideration of a difference in thermal expansion coefficient between the high-rigidity chip 6 and the first substrate 1 serving as the motherboard. In the case where the chip 6 is disposed with respect to the first substrate 1, as illustrated in FIGS. 12A and 12B, a large stress acts on the bumps disposed around the chip 6, thus increasing the distortion of the bumps. In other words, these bumps are prone to be damaged. The target bumps 10 of the substrate structure 200 are selected in this way. In particular, if the sealing resin of the LSI package 2 is thin, the influence of the difference in thermal expansion coefficient between the chip 6 and the first substrate 1 is large. Therefore, such selection of the target bumps 10 is advantageous in predicting the occurrence of a connection failure.

Figure 8:
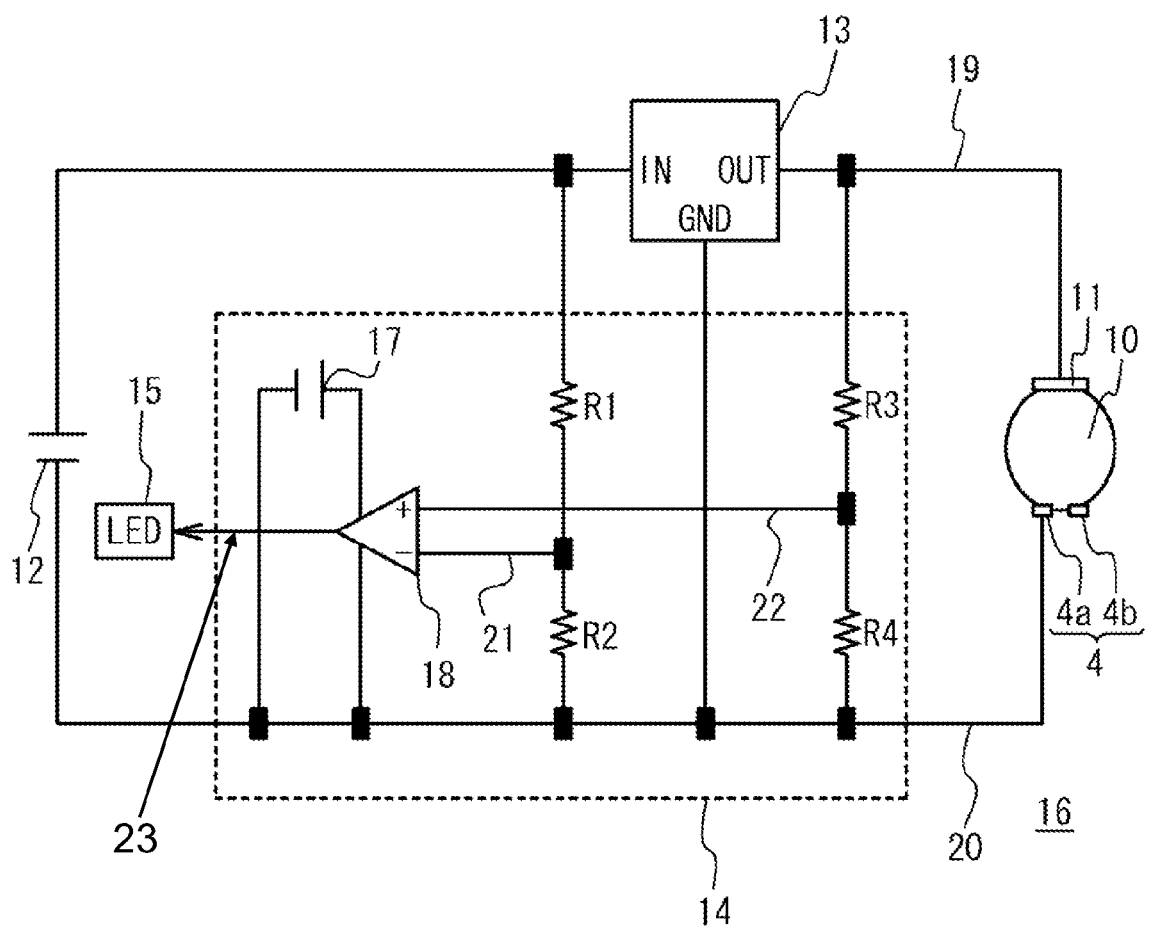
FIG. 8 is a circuit diagram illustrating an example of a disconnection detector.

The first separate electrodes 4a are each provided with the disconnection detector 16 illustrated in FIG. 8. This allows connection failures in the target bumps 10 of the substrate structure 200 to be grasped in advance.

In the above example, the pad electrodes 4 provided on the first substrate 1 include a plurality of pieces, for which the disconnection detector 16 is provided. Alternatively, as in the first embodiment, the pad electrodes 11 provided on the second substrate 5 may include a plurality of pieces, for which the disconnection detector 16 may be provided, as illustrated in FIG. 10. As another alternative, as illustrated in FIG. 11, both the pad electrodes 4 provided on the first substrate 1 and the pad electrodes 11 provided on the second substrate 5 may include a plurality of pieces.

Third Embodiment

Next, a substrate structure 300 according to a third embodiment will be described.

Figure 13:
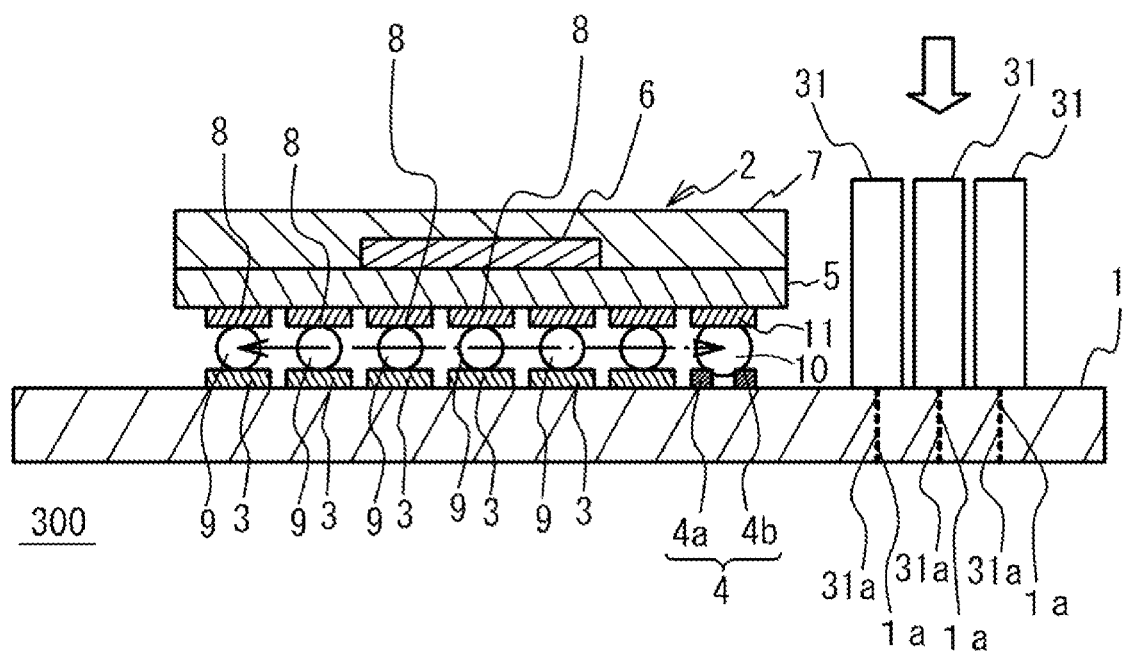
FIG. 13 is a cross-sectional view illustrating the arrangement of the bumps and the pad electrodes of a substrate structure according to a third embodiment.

Points different from the first embodiment will be described hereinbelow with reference to FIG. 13. FIG. 13 is a cross-sectional view of the second substrate 5 taken along a side edge thereof. Components common to the substrate structure 100 of the first embodiment are given the same reference numerals, and descriptions thereof will be omitted.

The substrate structure 300 of the third embodiment is configured such that bumps adjacent to connectors 31, an example of components inserted in the first substrate, are used as the target bumps 10. The pad electrodes 4 corresponding to the target bumps 10 include a plurality of pieces. A separation line is approximately parallel to the side edges of the second substrate 5 and the connectors 31, the each side edges being adjacent to the each target bump 10 corresponding to the pad electrode 4. The first separate electrode 4a and the second separate electrode 4b are arranged in perpendicular to the side edges of the second substrate 5 and the connectors 31, the side edges being adjacent to the target bump 10 corresponding to the pad electrode 4.

The substrate structure 300 is configured in consideration of the fact that when the connectors 31 are press-fitted in the first substrate 1, a stress acts on the bumps adjacent to the connectors 31, causing distortion. Specifically, during the process of manufacturing the substrate structure 300, first, the LSI package 2 is mounted on the first substrate 1, and thereafter, pins 31a of the connectors 31 are press-fitted in the mounting holes 1a provided in the first substrate 1. At that time, a stress is generated in the bumps in the vicinity of the connectors 31, thus causing distortion. Furthermore, also when another substrate and component is mounted to the connectors 31, a stress acts on the bumps adjacent to the connectors 31 to cause distortion. The target bumps 10 of the substrate structure 300 are thus selected.

The first separate electrodes 4a are each provided with the disconnection detector 16 illustrated in FIG. 8. This allows connection failures in the target bumps 10 of the substrate structure 300 to be grasped in advance.

In the above example, the pad electrodes 4 provided on the first substrate 1 include a plurality of pieces, for which the disconnection detector 16 is provided. Alternatively, as in the first embodiment, the pad electrodes 11 provided on the second substrate 5 may include a plurality of pieces, for which the disconnection detector 16 may be provided, as illustrated in FIG. 10. As another alternative, as illustrated in FIG. 11, both the pad electrodes 4 provided on the first substrate 1 and the pad electrodes 11 provided on the second substrate 5 may each include a plurality of pieces.

Fourth Embodiment

Next, a substrate structure 400 according to a fourth embodiment will be described.

Figure 14:
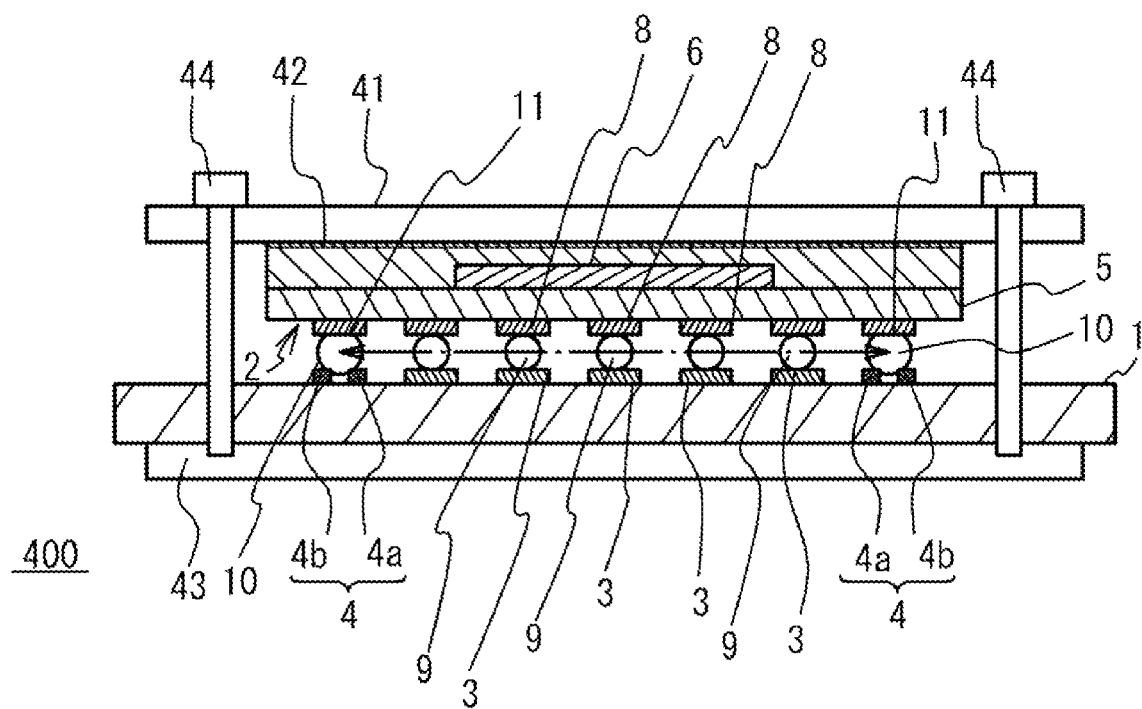
FIG. 14 is a cross-sectional view illustrating the arrangement of the bumps and the pad electrodes of a substrate structure according to a fourth embodiment.

Points different from the first embodiment will be described hereinbelow with reference to FIG. 14. FIG. 14 is a cross-sectional view of the second substrate 5 taken along a side edge thereof. Components common to the substrate structure 100 of the first embodiment are given the same reference numerals, and descriptions thereof will be omitted.

The substrate structure 400 of the fourth embodiment includes a first plate (third plate member) 41, a thermal sheet 42, and a second plate (fourth plate member) 43 which are examples of other components disposed so as to sandwich the first substrate 1 and the second substrate 5. The first plate 41 and the second plate 43 are held by bolts 44. The first plate 41 is a cooling plate. The second plate 43 is a bolster plate. The substrate structure 400 uses bumps adjacent to the bolts 44 as the target bumps 10. Pad electrodes 4 corresponding to the target bumps 10 include a plurality of pieces. A separation line of the pad electrode 4 is approximately parallel to the direction in which the bolts 44 are arranged. The first separate electrode 4a and the second separate electrode 4b are arranged in perpendicular to the direction in which the bolts 44 are arranged.

The substrate structure 400 is configured in consideration of the fact that a stress acts on the periphery of the bolts 44 by tightening the bolts 44, thus causing distortion.

The first separate electrodes 4a are each provided with the disconnection detector 16 illustrated in FIG. 8. This allows connection failures in the target bumps 10 of the substrate structure 400 to be grasped in advance.

In the above example, the pad electrodes 4 provided on the first substrate 1 include a plurality of pieces, for which the disconnection detector 16 is provided. Alternatively, as in the first embodiment, the pad electrodes 11 provided on the second substrate 5 may include a plurality of pieces, for which the disconnection detector 16 may be provided, as illustrated in FIG. 10. As another alternative, as illustrated in FIG. 11, both the pad electrodes 4 provided on the first substrate 1 and the pad electrodes 11 provided on the second substrate 5 may each include a plurality of pieces.

Although preferred embodiments have been described in detail, the present invention is not limited to such specific embodiments, and various modifications and changes can be made within the scope of the present invention described in the claims.

For example, the selection of target bumps, the separation pattern of pad electrodes, and the selection of regions for smaller separate electrodes may be changed variously depending on the configuration of the substrate structure.

While an LED is used as means for warning the occurrence of abnormality, another means, such as a buzzer, may be used. Furthermore, a warning may be displayed on the display of an electronic apparatus.

With the substrate disclosed in this specification, a connection failure of a protruding electrode can be grasped in advance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A substrate comprising:
a first plate member;
a plurality of first electrodes provided on the major surface of the first plate member, the first electrodes including at least one electrode for circuit connection and at least one monitor electrode separate from the electrode for circuit connection;
a second plate member;
a plurality of second electrodes provided on the major surface of the second plate member;
wherein said monitor electrode and said electrode for circuit connection are each arranged corresponding to a respective second electrode on said second plate member;
a plurality of solder members provided between the first electrodes and the second electrodes for electrical connection therebetween, repeatedly; and a detector for detecting an electrical disconnection between at least one of the monitor electrode and at least one of the second electrodes,
wherein at least one of the electrodes for circuit connection is electrically connected to at least one of the monitor electrodes via one of the solder member.

2. The substrate according to claim 1, wherein the monitor electrode has a configuration so as to evaluate an electrical connection between the at least one of the second electrodes and at least one electrode for circuit connection included in the first electrode that includes the at least one of the monitor electrode, the at least one electrode for circuit connection, and at least one of the second electrodes.

3. The substrate according to claim 1, wherein the dimension of the monitor electrode is smaller than that of the electrode for circuit connection.

4. The substrate according to claim 1, wherein the monitor electrode has a falcate shape.

5. The substrate according to claim 1, wherein at least one of the electrode for circuit connection is electrically connected to at least one of the monitor electrode via one of the solder members.

6. The substrate according to claim 5, wherein the at least one of the electrode and the at least one of the monitor electrode are provided at at least one end of the arrangement of the first electrodes in a diagonal direction of the second plate member.

7. The substrate according to claim 1, further comprising an electronic component provided on the second plate member,
wherein at least one of the electrode for circuit connection is electrically connected to the at least one monitor electrode via one of the solder members, and the at least one electrodes and the at least one monitor electrode are adjacent to a periphery of the electronic component.

8. The substrate according to claim 1, further comprising a component inserted in the first plate member, wherein the first and the second electrodes are adjacent to the component.

9. The substrate according to claim 1, further comprising:
a third and a fourth plate members sandwiching the first and the second plate members; and
a holding member holding the first and the second plate members,
wherein the first and the second electrodes are adjacent to the holding portion.

10. A substrate comprising:
a plate member; and
a plurality of electrodes provided on a major surface of the plate member for a ball grid array connection, at least one of the electrodes including a first electrode member and a second electrode member separate from the first electrode member,
wherein said first electrode member is an electrode for circuit connection and said second electrode member is a monitor electrode separate from the electrode for circuit connection,
wherein said ball grid array comprises a solder member, and
wherein at least one of the electrodes for circuit connection is electrically connected to at least one of the monitor electrodes via said solder member.

11. The substrate according to claim 10, wherein the at least one of the electrodes is provided at at least one end of the arrangement of the electrodes in a diagonal direction of the arrangement of the electrodes.

12. A substrate comprising:
a first plate member having a first area on the major surface thereof;
a plurality of first electrodes arranged on the first area, for ball grid array connection, the first electrodes including at least one electrode for circuit connection and at least one monitor electrode separate from the electrode for circuit connection;
a second plate member having a second area on the major surface thereof;
a plurality of second electrodes arranged on the second area, for ball grid array connection;
wherein said monitor electrode and said electrode for circuit connection are each arranged corresponding to a respective second electrode on said second plate member; and
a plurality of solder members provided between the first electrodes and the second electrodes for electrical connection, for ball grid array connection,
the electrodes including at least one electrode for circuit connection and at least one monitor electrode separate from the electrode for circuit connection,
wherein at least one of the electrode for circuit connection is electrically connected to at least one of the monitor electrode via one of the solder members.

* * * * *